United States Patent [19]

Perry et al.

[11] Patent Number: 5,043,227
[45] Date of Patent: Aug. 27, 1991

[54] POLYIMIDE AND COPPER METAL LAMINATES

[75] Inventors: William O. Perry; W. Frank Richey, both of Lake Jackson, Tex.

[73] Assignee: The Dow Chemical Company, Midland, Mich.

[21] Appl. No.: 355,723

[22] Filed: May 15, 1989

[51] Int. Cl.$^5$ ............................................. B32B 15/08
[52] U.S. Cl. ................................... 428/463; 156/310; 156/327; 156/332; 428/458; 428/473.5; 428/520
[58] Field of Search ...................... 428/463, 516, 35.7, 428/520, 458, 473.5, 457; 156/327, 310, 332

[56] References Cited

U.S. PATENT DOCUMENTS

| | | | |
|---|---|---|---|
| 3,998,990 | 12/1976 | Iwami et al. | 428/463 X |
| 4,092,452 | 5/1978 | Hori et al. | 428/463 |
| 4,132,857 | 1/1979 | Scarola et al. | 428/516 X |
| 4,656,068 | 4/1987 | Raines | 428/35.7 |

*Primary Examiner*—Thomas J. Herbert, Jr.
*Attorney, Agent, or Firm*—Douglas N. Deline

[57] ABSTRACT

A laminated structure comprising a copper metal substrate adhered to a polyimide polymer by the use of first and second adhesive resin layers.

10 Claims, No Drawings

POLYIMIDE AND COPPER METAL LAMINATES

BACKGROUND OF THE INVENTION

The present invention relates to a laminated structure comprising a copper metal substrate adhered to a polyimide resin film. More particularly the present invention relates to such a laminated structure having improved adhesion between the copper metal substrate and the polyimide film.

Laminates of copper foil and various polymers are well known in the art. Such laminates find industrial use in the preparation of electronic devices. Laminates of copper metal and polyolefin resins are employed as shielding tapes in armored cabled constructions. In U.S. Pat. No. 3,998,990 there are disclosed laminates of adhesive resins between various kinds of substrates. Particularly disclosed adhesive resins are in the form of metal containing copolymers consisting of monomeric units of ethylene, unsaturated carboxylic acids, unsaturated carboxylic acid metal salts, and unsaturated carboxylic acid esters. Such resins are excellent in workability and melt strength at the time of processing and also excellent in adhesiveness onto various kinds of substrates such as metals belonging to 1-B, II-B, III-A, IV-A, VI-B, VIII groups of the periodic table of the elements; glasses; polyolefins including homopolymers of α-olefins and copolymers containing α-olefins; polyamide resins; vinyl chloride resins; and vinylidene chloride resins.

Similarly, in U.S. Pat. No. 4,092,452 there is disclosed a plastic laminated metallic foil comprising a metal foil layer and a polyethylene, ethlene-vinyl acetate copolymer, ethylene unsaturated carboxylic acid ester copolymer or graft copolymer layer joined together by the use of an adhesive resin layer which could comprise inomeric derivatives of ethylene carboxylic acid copolymers.

In U.S. Pat. No. 4,132,857 there are disclosed electrical cables containing an improved adhesive layer for adhesion of the jacketing resin to the metal sheath. The adhesive resin comprised a dual layer film containing a film layer of an ethylene acrylic acid copolymer or an ethylene methacrylic acid copolymer or ionomer salts thereof and a film layer comprising polyethylene or an ethylene vinyl acetate copolymer.

The present invention relates to laminated structures comprising a copper metal substrate and a polyimide polymer layer. Such laminates are employed in the preparation of flexible electronic circuit boards. However, the obtention of satisfactory adhesion between a copper metal substrate and a polyimide film is exceedingly difficult. In order to obtain an acceptable level of adhesion (at least 4 pounds per lineal inch adhesion) the copper layer must be treated to provide a roughened surface. The procedure maximizes the surface area for adhesion and provides a mechanical interlock between the adhesive layer and the copper layer. For this purpose electrodeposited copper foil is generally used due to the roughened surface provided by the electrodeposition process. Where rolled copper foil is employed, strong oxidants must be applied to provide a roughened surface. This process is both expensive and a source of waste.

It would be desirable if there were provided a laminated structure comprising a copper metal substrate and a polyimide polymer layer said laminated structure having improved adhesion between the copper metal substrate and the polyimide polymer layer.

In addition it would be desirable if there were provided a laminated structure comprising a copper metal substrate and a polyimide polymer layer which may be prepared without the use of expensive conditioning processes to provide a roughened copper metal substrate surface.

Finally it would be desirable if there were provided a laminated structure comprising a copper metal substrate and a polyimide polymer layer which can be prepared in volume by contacting films of the various components utilizing short contact times at moderate temperature and pressure conditions.

SUMMARY OF THE INVENTION

According to the present invention there is now provided a laminated structure comprising:
  a) a copper metal substrate layer;
  b) a first adhesive resin layer comprising a first metal ion containing copolymer;
  c) a second adhesive resin layer comprising a second metal ion containing copolymer, said second metal ion being different from the first metal ion; and
  d) a polyimide polymer layer, said layers each comprising two major surfaces, the laminated structure being arranged such that one major surface of the copper metal substrate layer is in contact with the first major surface of the first adhesive resin layer, the remaining surface of which is in contact with the first major surface of the second adhesive resin layer, and the remaining surface of the second adhesive resin layer is in contact with a major surface of polyimide polymer layer.

In a further embodiment of the present invention there is provided a process for the preparation of a laminated structure comprising:
  (1) forming a first laminate of a copper metal substrate and a first adhesive resin layer comprising a first metal ion containing copolymer,
  (2) forming a second laminated structure comprising a polyimide polymer layer and a second adhesive resin layer comprising a second metal ion containing copolymer; and
  (3) contacting the first adhesive resin layer of the first laminated structure with the second adhesive resin layer of the second adhesive structure under conditions to provide a laminated structure.

DETAILED DESCRIPTION OF THE INVENTION

The copper metal substrates employed in the present laminated structure may be prepared by any suitable technique such as by rolling or otherwise working a solid metal ingot at elevated temperatures to provide a thin film or foil, or by electrodeposition of a thin metal film. The copper metal substrate layer may optionally be deposited or attached to an inert support such as a second metal sublayer. In another embodiment of the invention the copper surface may form an exposed surface of an assembly or mechanical construction. Although the exposed surface of the copper metal substrate may be roughed or textured by the use of chemical or mechanical techniques as previously disclosed, such a procedure is not required according to the present invention. The copper substrate layer may vary in thickness from 1.0 Angstrom to large thick sections, i.e. 10 mm. Preferred are films from 0.001 mm to 1.0 mm in thickness.

The polyimide polymer layer is generally provided in the form of a film. Suitable thicknesses for the polyimide polymer layer may be from 0.0005 mm to 10 mm, preferably from 0.001 to 1.0 mm. The polyimide film may be prepared by any suitable technique such as the blown film or cast film technique and may be oriented if desired to provide improved strength characteristics in one or both directions of the film direction. Suitable polyimide films are commercially available under the name Kapton® available from E. I. duPont DeNemours & Company.

The adhesive resins employed in the preparation of the presently disclosed laminated structure are selected to provide adhesion to the copper metal substrate and the polyimide polymer layers as well as adhesion between one another under thermal bonding conditions. The first adhesive resin layer preferably comprises a first metal ion containing copolymer (including graft copolymers) in which the ion is selected from $Cu^{+2}$ and $Zn^{+2}$ metal ions. Preferred ionomers are derivatives of unsaturated carboxylic acids, preferably acrylic acid or methacrylic acid. Additionally present in the copolymer may be monomeric units of ethylene, unsaturated carboxylic acid, and unsaturated carboxylic acid esters. As previously mentioned such carboxylic acid esters and carboxylic acid components may be prepared by copolymerization of the various monomeric units or a graft copolymerization in which a base polymer comprising principally an olefin resin is grafted with the carboxylic acid. Ionomeric derivatives may be prepared by subsequent neutralization with a suitable metal compound. Suitable techniques for the preparation of carboxylic acid containing copolymers and graft copolymers as well as the neutralization thereof to form ionomeric derivatives are well known in the art. Resins containing various metal ions are commercially available under the tradename Surlyn™ available from E. I. duPont DeNemours & Company.

The second adhesive resin layer differs from the first adhesive resin layer in at least one respect, that is, the metal ion of the second adhesive resin layer must differ from the metal ion of the first adhesive resin layer. Preferably the metal ion of the second adhesive resin layer is selected from the group consisting of $Mg^{+2}$ and $Al^{+3}$. In other respects the adhesive copolymer is as previously described for the first adhesive resin layer.

In a highly preferred embodiment the copper and zinc ion content in the first adhesive resin layer is in a range from about 1 percent to 10 percent by weight, most preferably from 2 percent to 8 percent by weight. Similarly, the metal ion content of the second adhesive resin is from 0.01 to 2 percent by weight, most preferably from 0.1 to 1 percent by weight.

If desired the operator may employ the above first and second adhesive resin layer in admixture as a blend with additional resins if desired. However, improved adhesion is obtained where the adhesive resin layers consist essentially of ionomeric copolymers of ethylene and acrylic acid or methacrylic acid.

While the thickness of the first and second adhesive layers is not critical it is desired in order to minimize the cost of the resulting structure that such layers be as thin as possible. Preferably adhesive layer thicknesses from 0.001 mm to 10 mm, most preferably from 0.01 mm to 0.25 mm are employed.

The laminated structure may be prepared in any order, that is by successive application of a first adhesive resin layer, a second adhesive resin layer and a polyimide polymer layer to a copper metal substrate; or application first of the separate adhesive resin layers to the copper metal substrate and the polyimide polymer layer respectively followed by joining of the two separately prepared laminates to form a single laminated structure. Suitable operating limits for preparation of the various laminated structures include the use of heated two-roll presses operating at temperatures from about 240° C. to 300° C. More specifically the first adhesive resin is preferably contacted to a copper metal substrate at a temperature of 240° C. to 260° C. for a time and under a pressure sufficient to obtain the desired adhesion strength. The second adhesive resin is suitably contacted with a polyimide polymer layer at a temperature from 280° C. to 300° C. for a time and under a pressure sufficient to obtain the desired adhesion strength.

The finished laminated structure may be obtained by contacting the two previously prepared structures so that the two adhesive resin layers are brought into intimate contact at a temperature in the range from 180° C. to 250° C. for a time and under a pressure sufficient to obtain the desired degree of adhesion. Typical pressure and times of contact for the above procedures are 100–10,000 psi (689–68,900 kPa) pressure and 1.0–1000 seconds, preferably 60–200 seconds contact time. The various laminating steps may be conducted in a continuous process or in batches. The various laminates and the finished laminated structure may be cut or shaped by stamping or other suitable technique. Typically adhesion between the copper foil and polyimide film may vary from 4 pounds per lineal inch to 20 pounds per lineal inch or more (6.7–35 N/cm), preferably from 10 pounds per lineal inch to 18 pounds per lineal inch (17.5–31 N/cm).

Having described the invention the following examples are provided as further illustrative and are not to be construed as limiting. Where stated all parts and percentages are expressed by weight.

EXAMPLE 1

A copper ion crosslinked copolymer of 80 percent ethylene and 20 percent acrylic acid containing 8.0 percent $Cu^{++}$ ions was pressed at 250° C. on untreated, copper foil (Gould Electronics, Foil Division) at approximately 1000 psi (6,894 kPa). The press platens were closed to lightly touching for 2 minutes and then closed to full pressure for 2 minutes. The piece was removed and peeled away from the fluoropolymer release cloth. A second laminated structure was made similarly, in which a 5 mil polyimide film substrate (Kapton® available from E. I. duPont DeNemours & Company) and a $Mg^{+2}/Al^{+3}$ ion crosslinked copolymer of 80 percent ethylene and 20 percent acrylic acid containing 0.23 percent of $Mg^{+2}$ and 0.14 percent $Al^{+3}$ were used to form the laminate. This was pressed at a temperature of 295° C. for a similar time and pressure as the copper foil laminate.

The two laminates were then placed in the press so that the $Cu^{+2}$ ionomer side of the first laminate was contacting the $Mg^{+2}/Al^{+3}$ ionomer side of the second laminate. The article was pressed at 250° C. at approximately 1000 psi (6,984 kPa) for two minutes after a two-minute pre-heat. The bonded laminate of copper foil and polyimide film was cut into strips 1-inch (2.54 cm) wide and the adhesion was measured by using a T-peel test similar to ASTM D-1876-72. The average adhesive strength was 17.0 lbs/lineal inch (30 N/cm).

What is claimed is:

1. A laminated structure comprising:
   a) a copper metal substrate layer;
   b) a first adhesive resin layer comprising a first metal ion containing ionomer;
   c) a second adhesive resin layer comprising a second metal ion containing ionomer, said second metal ion being different from the first metal ion; and
   d) a polyimide polymer layer, said layers each comprising two major surfaces, the laminated structure being arranged such that one major surface of the copper metal substrate layer is in contact with the first major surface of the first adhesive resin layer, the remaining surface of which is in contact with the first major surface of the second adhesive resin layer, and the remaining surface of the second adhesive resin layer is in contact with a major surface of polyimide polymer layer.

2. A laminated structure according to claim 1 wherein the first adhesive resin comprises an ionomeric derivative of a copolymer of ethylene and acrylic acid or methacrylic acid.

3. A laminated structure according to claim 1 wherein the first adhesive resin comprises a $Cu^{+2}$ or $Zn^{+2}$ metal ionomer.

4. A laminated structure according to claim 1 wherein the second adhesive resin layer comprises an ionomeric derivative of a copolymer of ethylene and acrylic acid or methacrylic acid.

5. A laminated structure according to claim 1 wherein the second adhesive resin layer comprises a $Mg^{+2}$ or $Al^{+3}$ ionomer.

6. A process for preparing a laminated structure comprising:
   (1) forming a first laminate of a copper metal substrate and a first adhesive resin layer comprising a first metal ion containing ionomer,
   (2) forming a second laminated structure comprising a polyimide polymer layer and a second adhesive resin layer comprising a second metal ion containing ionomer; and
   (3) contacting the first adhesive resin layer of the first laminated structure with the second adhesive resin layer of the second adhesive structure under conditions to provide a laminated structure.

7. A process according to claim 6 wherein the first adhesive resin layer comprises an ionomeric derivative of a copolymer of ethylene and acrylic acid or methacrylic acid.

8. A process according to claim 6 wherein the first adhesive resin comprises a $Cu^{+2}$ or $Zn^{+2}$ ionomer.

9. A process according to claim 6 wherein the second adhesive resin comprises an ionomeric derivative of a copolymer of ethylene and acrylic acid or methacrylic acid.

10. A process according to claim 6 wherein the second adhesive resin comprises a $Mg^{+2}$ or $Al^{+3}$ ionomer.

* * * * *